(12) United States Patent
Kim et al.

(10) Patent No.: US 11,839,042 B2
(45) Date of Patent: *Dec. 5, 2023

(54) DISPLAY DEVICE

(71) Applicant: SAMSUNG DISPLAY CO., LTD., Yongin-si (KR)

(72) Inventors: Yunjae Kim, Cheonan-si (KR); Minseop Kim, Cheonan-si (KR); Bugyoon Yoo, Hwaseong-si (KR); Munsik Ham, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/161,658

(22) Filed: Jan. 30, 2023

(65) Prior Publication Data

US 2023/0180414 A1    Jun. 8, 2023

Related U.S. Application Data

(63) Continuation of application No. 17/331,038, filed on May 26, 2021, now Pat. No. 11,570,920.

(30) Foreign Application Priority Data

Aug. 14, 2020    (KR) .................. 10-2020-0102602

(51) Int. Cl.
*H05K 5/00* (2006.01)
*H05K 5/03* (2006.01)
(Continued)

(52) U.S. Cl.
CPC ............. *H05K 5/03* (2013.01); *G06F 1/1637* (2013.01); *H05K 5/0217* (2013.01)

(58) Field of Classification Search
CPC ..... H05K 5/03; H05K 5/0017; H04M 1/0214; H04M 1/0268; G06F 1/1652; G06F 1/1637; G06F 1/1616; G06F 1/1656; G09F 9/301

See application file for complete search history.

(56) References Cited

U.S. PATENT DOCUMENTS 11,181,942 B1    11/2021  Feng
2010/0061040 A1*  3/2010  Dabov .................. H04M 1/026
                                                        361/679.01
(Continued)

FOREIGN PATENT DOCUMENTS

EP    3 293 606 A1    3/2018
JP    2010-189013 A    9/2010

OTHER PUBLICATIONS

EPO Search Report dated Dec. 14, 2021 issued in European Patent Application No. 21188999.3, 8 pages.

*Primary Examiner* — Sagar Shrestha
(74) *Attorney, Agent, or Firm* — Lewis Roca Rothgerber Christie LLP

(57) ABSTRACT

A display device includes a window, a display module on a rear surface of the window, and including a folding area, and a non-folding area adjacent to the folding area, and a protective cover on a rear surface of the display module, and including a cover portion configured to cover the folding area and the non-folding area of the display module, and holding portions extending in a first direction, or in a second direction crossing the first direction, from the cover portion, and protruding outside the display module when viewed in a plane.

20 Claims, 16 Drawing Sheets

(51) Int. Cl.
*H05K 5/02* (2006.01)
*G06F 1/16* (2006.01)

(56) References Cited

U.S. PATENT DOCUMENTS

| | | |
|---|---|---|
| 2015/0382484 A1 | 12/2015 | Jung et al. |
| 2017/0062742 A1 | 3/2017 | Kim |
| 2017/0155084 A1 | 6/2017 | Park et al. |
| 2018/0076412 A1 | 3/2018 | Kim et al. |
| 2019/0014669 A1 | 1/2019 | Ahn et al. |
| 2019/0208649 A1 | 7/2019 | Jeon et al. |
| 2020/0057472 A1 | 2/2020 | Kang et al. |
| 2020/0135063 A1 | 4/2020 | Jang |
| 2020/0163231 A1 | 5/2020 | Park |
| 2020/0175897 A1 | 6/2020 | Choi |
| 2021/0150944 A1 | 5/2021 | Yoon et al. |
| 2021/0311347 A1* | 10/2021 | Ono .................... G02F 1/13338 |
| 2021/0360799 A1 | 11/2021 | Jia et al. |

* cited by examiner

FIG. 8A
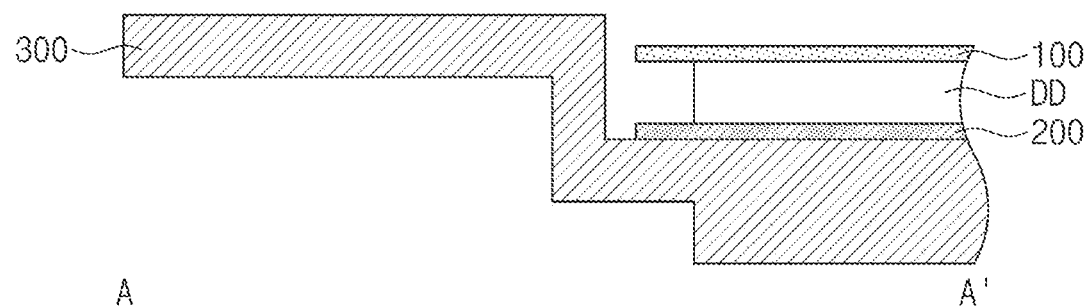
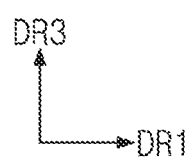
FIG. 8B
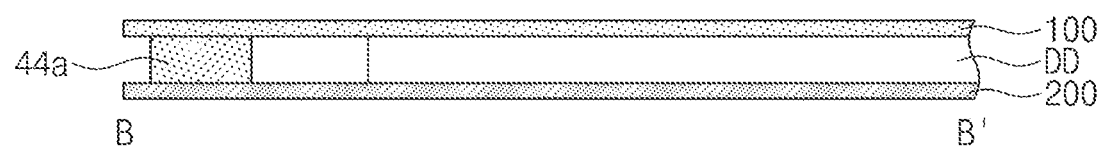
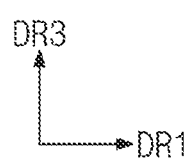

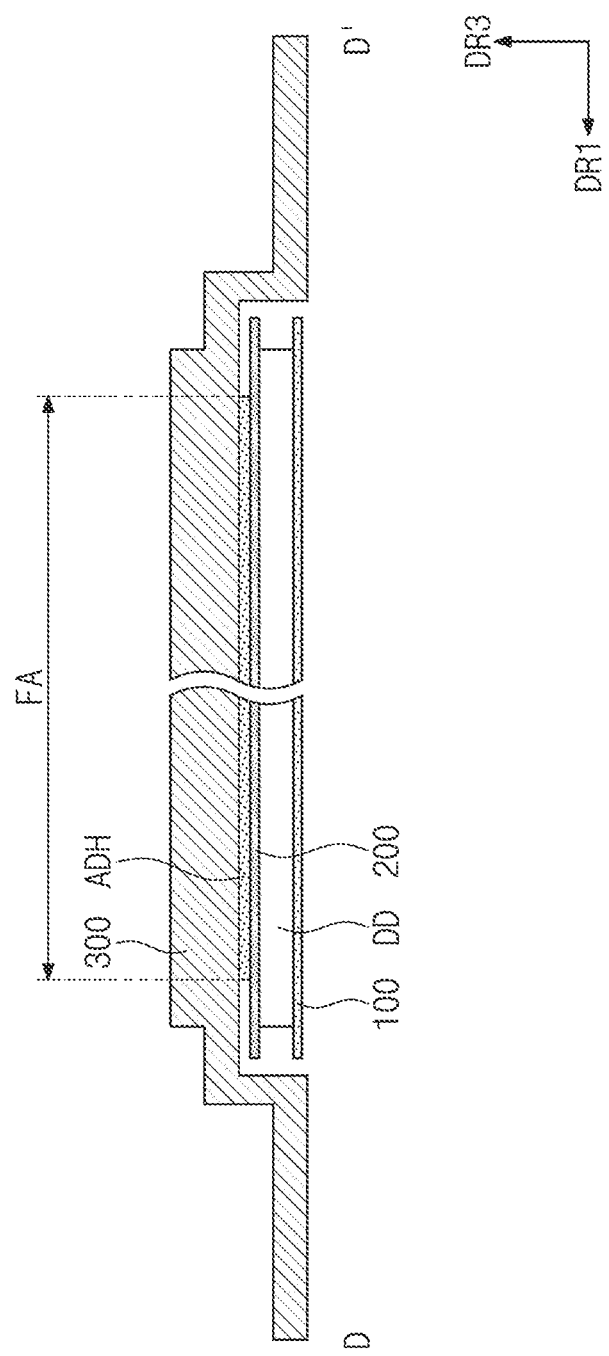

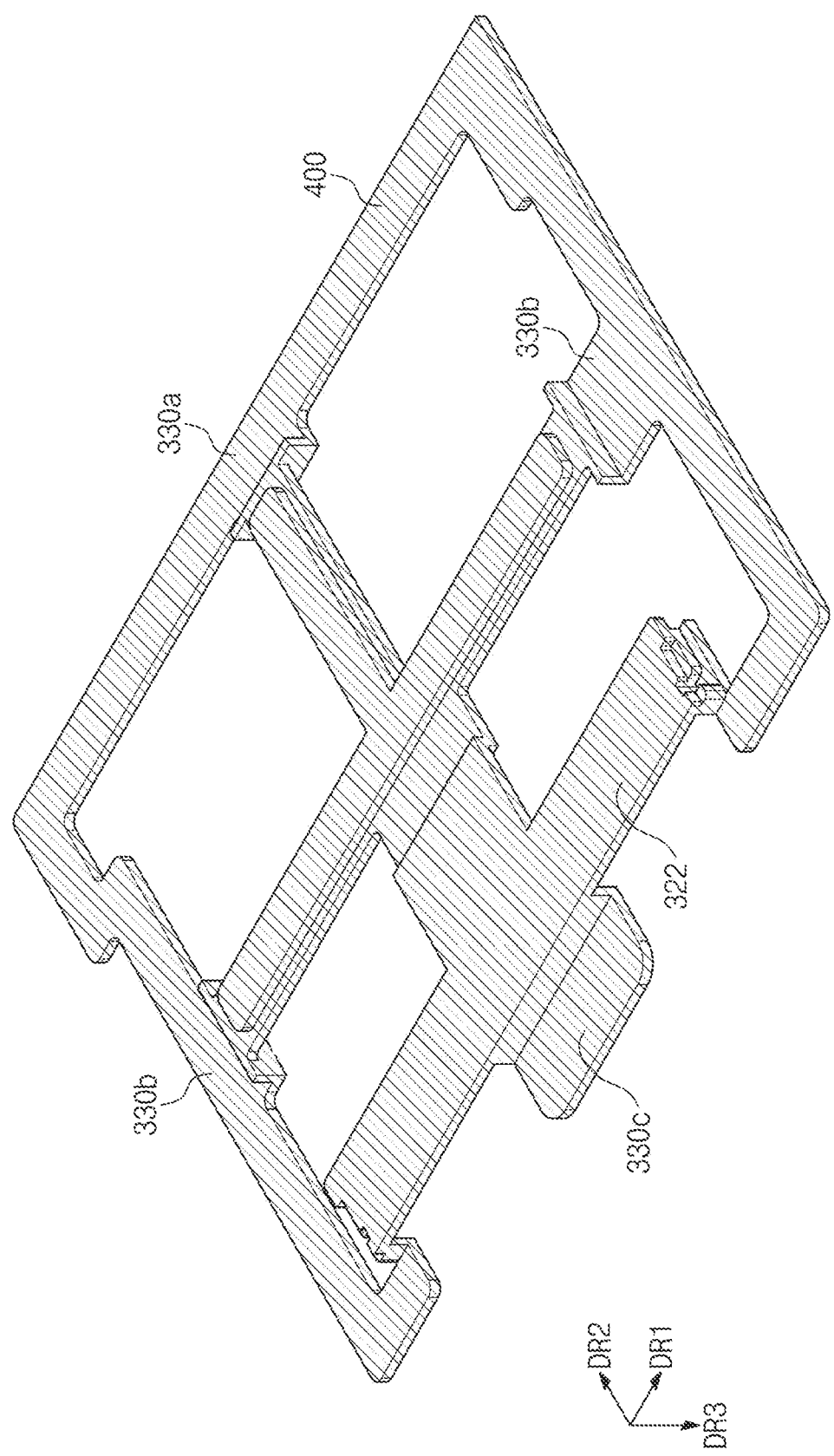

DISPLAY DEVICE

CROSS-REFERENCE TO RELATED APPLICATIONS

This application is a continuation of U.S. patent application Ser. No. 17/331,038, filed May 26, 2021, which claims priority to and the benefit of Korean Patent Application No. 10-2020-0102602, filed Aug. 14, 2020, the entire content of both of which is incorporated herein by reference.

BACKGROUND

1. Field

The present disclosure relates to a display device having reduced defects.

2. Description of the Related Art

Electronic devices, such as a smartphone, a tablet computer, a notebook computer, a smart television, etc., are being developed. The electronic devices include a display device to provide information. The electronic devices further include various electronic modules in addition to the display device.

The electronic device is manufactured by assembling the display device with the electronic modules. In this case, the electronic modules are organically arranged using an external case and a bracket.

SUMMARY

The present disclosure provides a display device that is capable of being protected from external impacts while being transferred in a manufacturing process of an electronic device.

Embodiments of the present disclosure provide a display device including a window, a display module on a rear surface of the window, and including a folding area, and a non-folding area adjacent to the folding area, and a protective cover on a rear surface of the display module, and including a cover portion configured to cover the folding area and the non-folding area of the display module, and holding portions extending in a first direction, or in a second direction crossing the first direction, from the cover portion, and protruding outside the display module when viewed in a plane.

The window may include a thin film glass.

The non-folding area may include a first non-folding area and a second non-folding area, which are separated by the folding area, wherein the cover portion includes a first cover portion configured to support the folding area and the first non-folding area of the display module, and a second cover portion configured to support the second non-folding area.

The display module may further include a non-bending area including the folding area and the non-folding area, and a bending area bent from the non-bending area, wherein the second cover portion covers the bending area.

The first cover portion may include a first body portion connected to the second cover portion, a first portion extending from the first body portion in a direction away from the second cover portion, and a second portion extending from the first body portion in another direction crossing the direction.

The first and second portions may have a bar shape, and may be perpendicular to each other when viewed in a plane.

The second portion may be configured to overlap the folding area.

The second cover portion may include a second body portion connected to the first cover portion, and configured to cover the second non-folding area, and an arm portion extending in a direction crossing the second body portion, and configured to cover a portion of the bending area.

The second cover portion may further include a sidewall portion extending from the arm portion, and configured to cover a remaining portion of the bending area.

The holding portions may include a first holding portion coupled to the first portion, and second holding portions coupled to the second portion.

The holding portions may include a third holding portion extending from the arm portion in a direction away from the second body portion.

The holding portions may be bent from the cover portion, and may be configured to cover a portion of a side surface of the display module.

Embodiments of the present disclosure provide a display device including a folding area, a first non-folding area adjacent to the folding area, a second non-folding area adjacent to the folding area, a window, a display module on a rear surface of the window, and including a non-bending area, and a bending area bent from the non-bending area, a first release film on the window, a second release film under the display module, and a protective cover under the second release film, and including a first cover portion configured to support the folding area and the first non-folding area, a second cover portion extending from the first cover portion, and configured to support the second non-folding area and the bending area of the display module, and holding portions respectively coupled to the first cover portion and the second cover portion.

The display device may further include adhesive members between the first and second release films, outside the display module, and configured to attach the first and second release films.

The second release film may include a first portion overlapping the first non-folding area, a second portion overlapping the second non-folding area, and a third portion overlapping the folding area, wherein the protective cover further includes an adhesive member attached to the third portion.

A cutting line may be defined between the first portion and the third portion, and between the second portion and the third portion.

The first cover portion may include a first portion on a lower surface of the first portion of the second release film, and extending in a first direction, and a second portion on a lower surface of the third portion of the second release film, extending in a second direction crossing the first direction, and including the adhesive member.

The second portion may expose a portion of the first non-folding area and the bending area.

The second cover portion may cover the bending area and the exposed portion of the second non-folding area, and may be spaced apart from the display module in a thickness direction.

Embodiments of the present disclosure provide a display device including a window, a display module on a rear surface of the window, and including a folding area, and a non-folding area adjacent to the folding area, and a protective cover on a rear surface of the display module, and including a cover portion covering the folding area and the non-folding area of the display module, and holding portions extending in a first direction, or in a second direction crossing the first direction, from the cover portion, protruding outside the display module when viewed in a plane, and connected to each other outside the display module.

According to the above, the display device includes the cover portion, which entirely covers the display module, and the holding portions, and thus, the components including the window and the display module are effectively protected from the external impacts during a manufacturing process.

BRIEF DESCRIPTION OF THE DRAWINGS

The above and other aspects of the present disclosure will become readily apparent by reference to the following detailed description when considered in conjunction with the accompanying drawings wherein:

FIGS. 8A to 8D are cross-sectional views showing a display device according to some embodiments of the present disclosure;

FIG. 9A is a perspective view showing a protective cover according to other embodiments of the present disclosure;

DETAILED DESCRIPTION

Figure 1A:
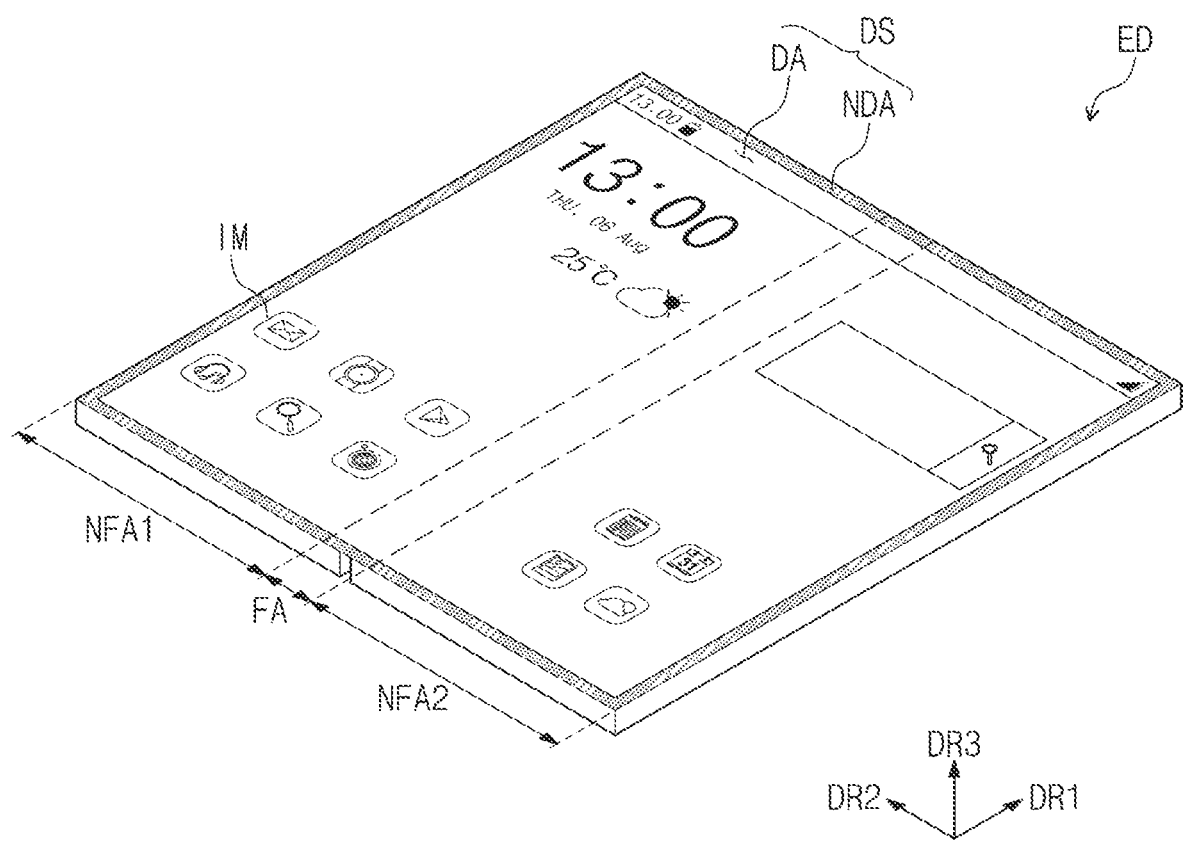
FIGS. 1A and 1B are perspective views showing an electronic device according to some embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
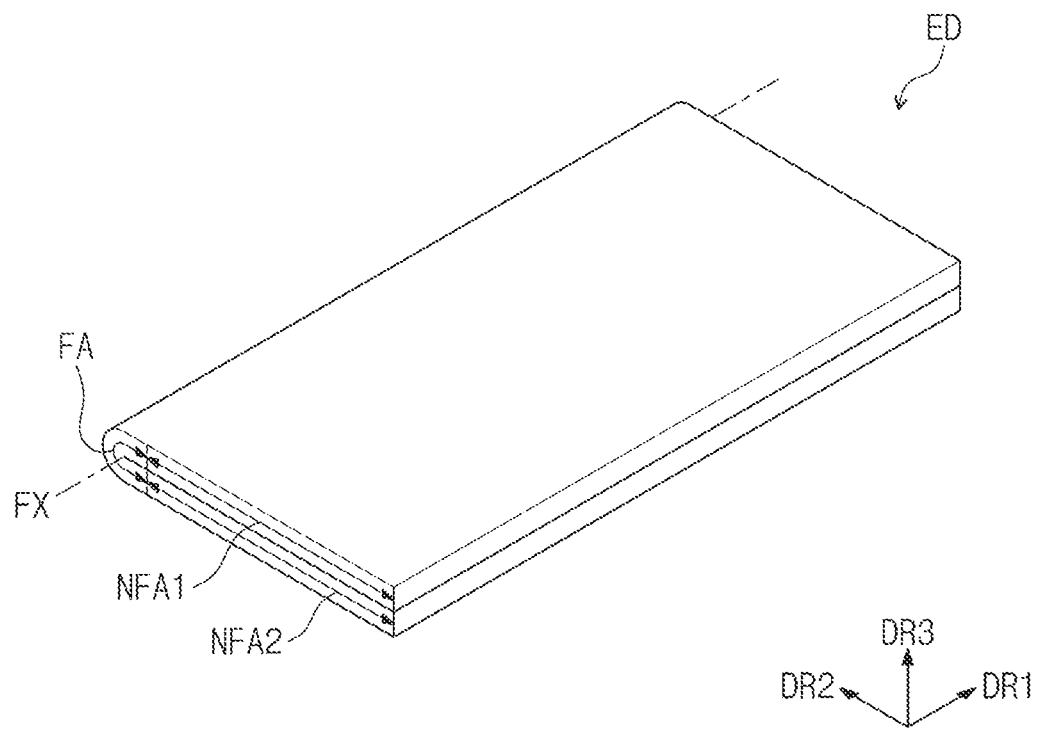

FIGS. 1A and 1B are perspective views showing an electronic device ED according to some embodiments of the present disclosure.

FIG. 1A shows an unfolded state of the electronic device ED, and FIG. 1B shows a folded state of the electronic device ED.

Referring to FIGS. 1A and 1B, the electronic device ED may include a display surface DS defined by a first direction DR1 and a second direction DR2 crossing the first direction DR1. The electronic device ED may provide an image IM to a user through the display surface DS.

The display surface DS may include a display area DA, and a non-display area NDA around the display area DA. The display area DA may display the image IM, and the non-display area NDA might not display the image IM. The non-display area NDA may surround the display area DA. However, the shape of the display area DA and the non-display area NDA may be changed without being limited thereto or thereby.

Hereinafter, a direction substantially perpendicular to a plane defined by the first direction DR1 and the second direction DR2 may be referred to as a third direction DR3. In addition, the expression "when viewed in a plane" may mean a state of being viewed in the third direction DR3. Hereinafter, the first, second, and third directions DR1, DR2, and DR3 are directions respectively indicated by first, second, and third directional axes.

The electronic device ED may include a folding area FA and a plurality of non-folding areas NFA1 and NFA2. The non-folding areas NFA1 and NFA2 may include a first non-folding area NFA1 and a second non-folding area NFA2. In the second direction DR2, the folding area FA may be located between the first non-folding area NFA1 and the second non-folding area NFA2.

As shown in FIG. 1B, the folding area FA may be folded about a folding axis FX substantially parallel to the first direction DR1. The folding area FA may have a curvature (e.g., a predetermined curvature) and a radius of curvature (e.g., a predetermined radius of curvature). The electronic device ED may be inwardly folded (inner-folding) such that the first non-folding area NFA1 and the second non-folding areas NFA2 face each other, and such that the display surface DS is not exposed to the outside.

In some embodiments of the present disclosure, the electronic device ED may be outwardly folded (outer-folding) such that the display surface DS is exposed to the outside. In some embodiments of the present disclosure, the electronic device ED may be inwardly and outwardly folded in the unfolded state, however, it should not be limited thereto or thereby. In some embodiments of the present disclosure, the electronic device ED may be operated in one of an unfolding operation, an inner-folding operation, and an outer-folding operation.

Figure 2:
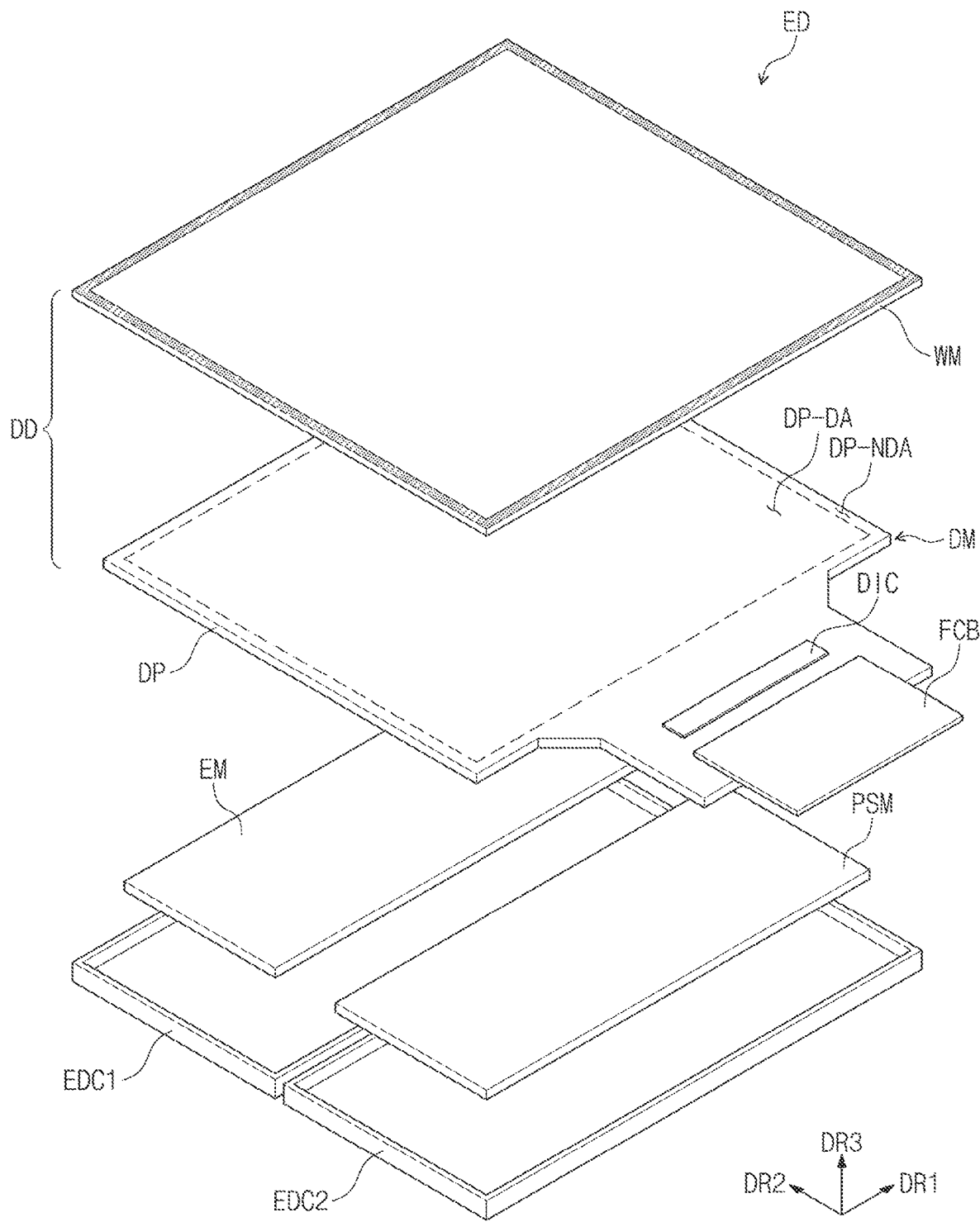
FIG. 2 is an exploded perspective view showing an electronic device according to some embodiments of the present disclosure.

FIG. 2 is an exploded perspective view showing the electronic device ED according to some embodiments of the present disclosure.

Referring to FIG. 2, the electronic device ED may include a display unit DD, an electronic module EM, a power module PSM, and a case EDC1 and EDC2. In some embodiments, the power module PSM may further include a mechanical structure to control the folding operation of the display unit DD.

The display unit DD may generate an image and may sense an external input. The display unit DD may include a window WM and a display module DM. The window WM may provide a front surface of the electronic device ED. The window WM may include a thin film glass. That is, the window WM may have a thin thickness. For example, the window WM may have a thickness that is equal to, or smaller than, about 30 um.

The display unit DD may serve as a component of the electronic device ED.

The display module DM may include at least a display panel DP. In FIG. 2, the display module DM is shown as being the same as the display panel DP, however, the display module DM may be a stack structure in which multiple components are stacked.

The display panel DP may include a display area DP-DA and a non-display area DP-NDA, which respectively correspond to the display area DA (refer to FIG. 1A) and the non-display area NDA (refer to FIG. 1A) of the electronic device ED. In the present disclosure, the expression "an area/portion corresponds to another area/portion" may mean that "an area/portion overlaps another area/portion", and the respective "areas and portions" should not be limited to have the same size as each other. The display module DM may include a driving chip DIC located on the non-display area DP-NDA. The display module DM may further include a flexible circuit film FCB coupled to the non-display area DP-NDA.

The driving chip DIC may include driving elements, e.g., a data driving circuit, to drive pixels of the display panel DP. FIG. 2 shows a structure in which the driving chip DIC is mounted on the display panel DP, however, the present disclosure should not be limited thereto or thereby. For example, the driving chip DIC may be mounted on the flexible circuit film FCB.

The electronic module EM may include at least a main controller. The electronic module EM may include a wireless communication module, a camera module, a proximity sensor module, an image input module, an audio input module, an audio output module, a memory, and an external interface module. The modules may be mounted on a circuit substrate or may be electrically connected to each other through a flexible circuit board. The electronic module EM may be electrically connected to the power module PSM.

The main controller may control an overall operation of the electronic device ED. For example, the main controller may activate or deactivate the display unit DD in response to a user's input. The main controller may control an operation of the display unit DD and other modules. The main controller may include at least one microprocessor.

The display module DM, the electronic module EM, and the power module PSM may be accommodated in cases EDC1 and EDC2. In FIG. 2, two cases EDC1 and EDC2 are shown to be separated from each other, however, they should not be limited thereto or thereby. In some embodiments, the electronic device ED may further include a hinge structure to connect the two cases EDC1 and EDC2 to each other. The cases EDC1 and EDC2 may be connected to the window WM. The cases EDC1 and EDC2 may protect the display module DM, the electronic module EM, and the power module PSM, which are accommodated therein.

Figure 3A:
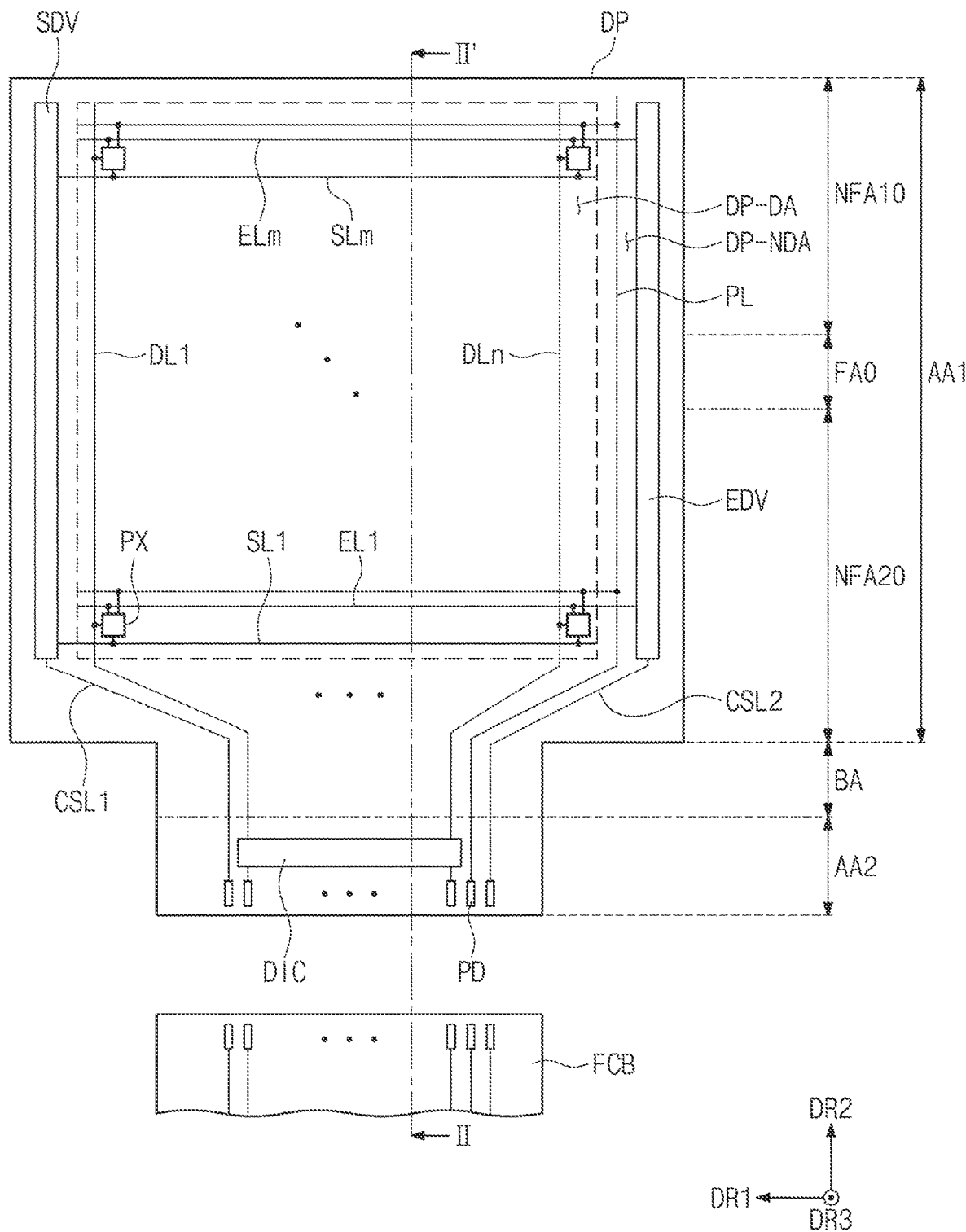
FIG. 3A is a plan view showing a display panel according to some embodiments of the present disclosure.
Figure 3B:
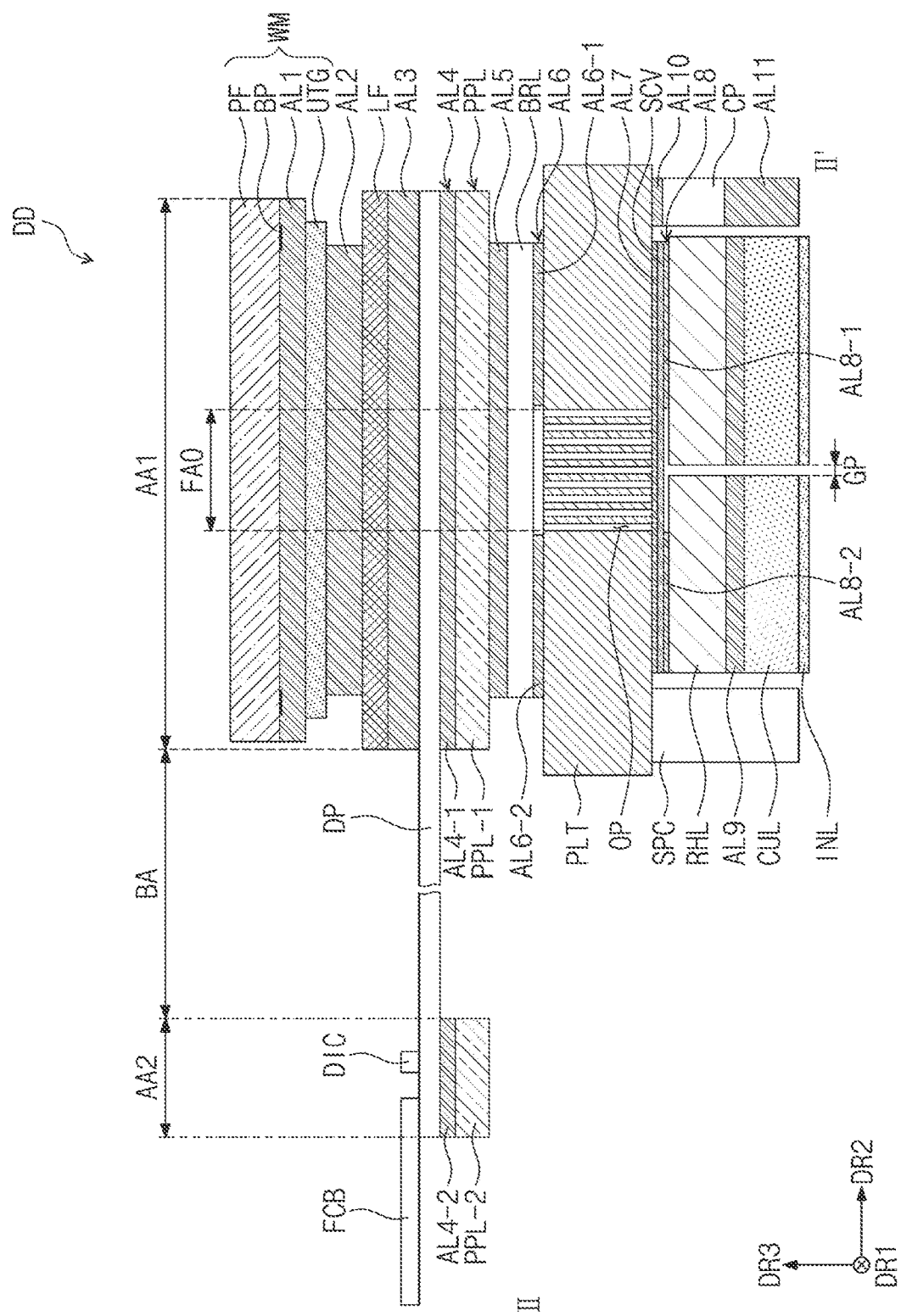
FIG. 3B is a cross-sectional view showing a display unit according to some embodiments of the present disclosure.
Figure 3C:
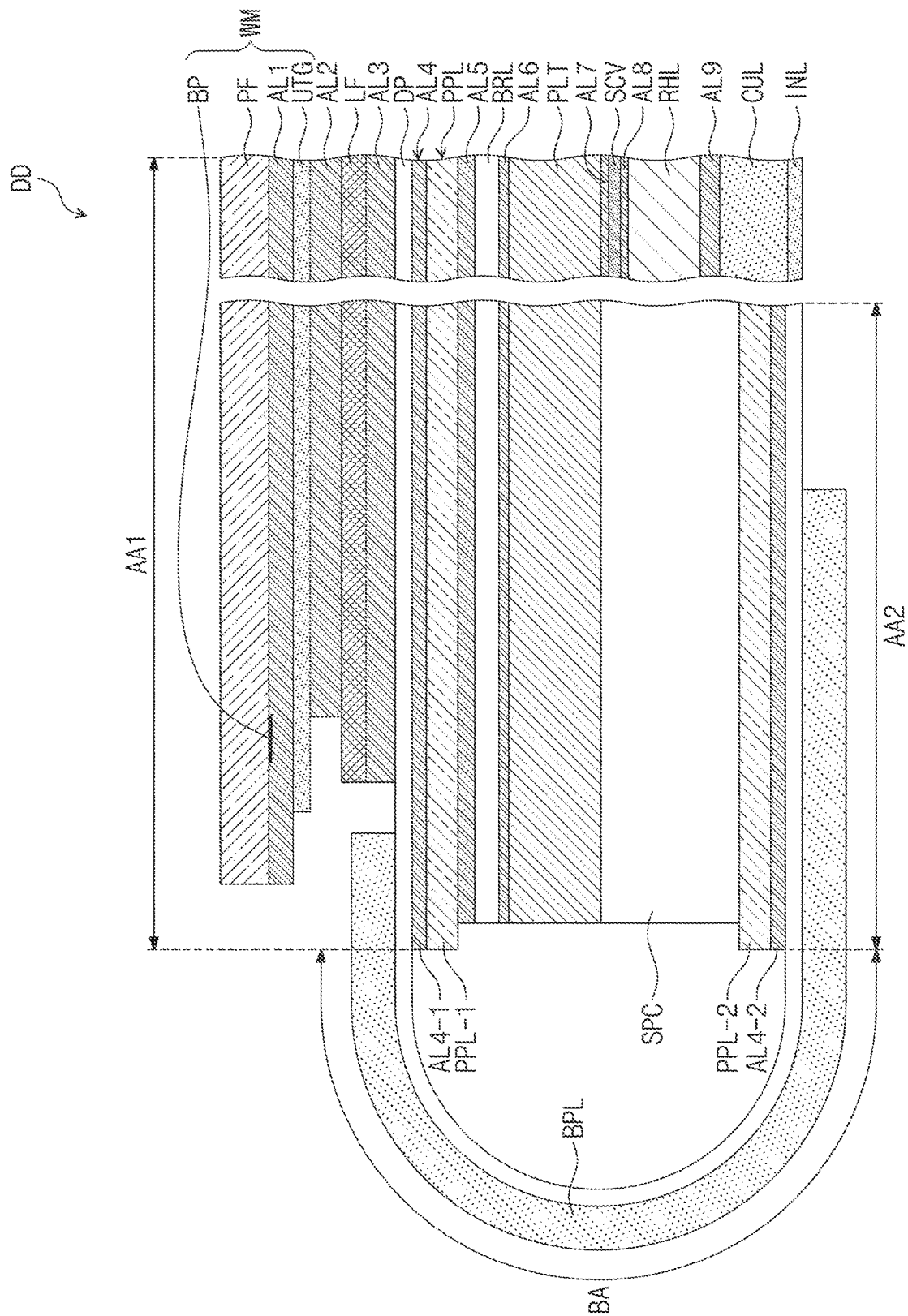
FIG. 3C is a cross-sectional view showing a display unit according to some embodiments of the present disclosure.

FIG. 3A is a plan view showing the display panel DP according to some embodiments of the present disclosure, FIG. 3B is a cross-sectional view showing the display unit DD according to some embodiments of the present disclosure, and FIG. 3C is a cross-sectional view showing the display unit DD according to some embodiments of the present disclosure.

Referring to FIG. 3A, the display panel DP may include the display area DP-DA, and the non-display area DP-NDA around the display area DP-DA. The display area DP-DA and the non-display area DP-NDA may be distinguished from each other depending on whether the pixels PX are arranged. The pixels PX may be located in the display area DP-DA. A scan driver SDV, a data driver, and an emission driver EDV may be located in the non-display area DP-NDA. The data driver may serve as a circuit of the driving chip DIC shown in FIG. 3A.

The display panel DP may include a first area AA1, a second area AA2, and a bending area BA, which are distinct from each other in the second direction DR2. The second area AA2 and the bending area BA may be portions of the non-display area DP-NDA. The bending area BA may be located between the first area AA1 and the second area AA2. The first area AA1 may be a non-bending area.

FIG. 3B shows the display panel DP in the unfolded state before being folded. When assuming that the display panel DP is installed in the electronic device ED, the first area AA1 and the second area AA2 of the display panel DP may be located on different planes from each other in the unfolded state of the electronic device ED as shown in FIG. 1A. This is shown in FIG. 3C. The shape of the bending area BA will be described later with reference to FIG. 3C.

Referring to FIG. 3A again, the first area AA1 may correspond to the display surface DS of FIG. 1A. The first area AA1 may include a first non-folding area NFA10, a second non-folding area NFA20, and a folding area FAO. The first non-folding area NFA10, the second non-folding area NFA20, and the folding area FAO may correspond to the first non-folding area NFA1, the second non-folding area NFA2, and the folding area FA of FIGS. 1A and 1B, respectively.

In the first direction DR1, the bending area BA and the second area AA2 may have a length that is smaller than a length of the first area AA1. An area where a length in a bending axis direction is short may be easily bent.

The display panel DP may include a plurality of pixels PX, a plurality of scan lines SL1 to SLm, a plurality of data lines DL1 to DLn, a plurality of emission lines EL1 to ELm ("m" and "n" being natural numbers), first and second control lines CSL1 and CSL2, a power line PL, and a plurality of pads PD. The pixels PX may be connected to the scan lines SL1 to SLm, the data lines DL1 to DLn, and the emission lines EL1 to ELm.

The scan lines SL1 to SLm may extend in the first direction DR1, and may be connected to the scan driver SDV. The data lines DL1 to DLn may extend in the second direction DR2, and may be connected to the driving chip DIC while passing through the bending area BA. The emission lines EL1 to ELm may extend in the first direction DR1 and may be connected to the emission driver EDV.

The power line PL may include a portion extending in the second direction DR2 and a portion extending in the first direction DR1. The portion extending in the first direction DR1 and the portion extending in the second direction DR2 may be located on different layers from each other. The portion of the power line PL, which extends in the second direction DR2, may extend to the second area AA2 through the bending area BA. The power line PL may provide a first voltage to the pixels PX.

The first control line CSL1 may be connected to the scan driver SDV, and may extend to a lower end of the second area AA2 through the bending area BA. The second control line CSL2 may be connected to the emission driver EDV, and may extend to a lower end of the second area AA2 through the bending area BA.

When viewed in a plane, the pads PD may be located adjacent to the lower end of the second area AA2. The driving chip DIC, the power line PL, the first control line CSL1, and the second control line CSL2 may be connected to the pads PD. The flexible circuit film FCB may be electrically connected to the pads PD through an anisotropic conductive adhesive layer.

Referring to FIGS. 3B and 3C, the display unit DD may include the window WM and the display module DM (see FIG. 2).

The display module DM may include an optical film LF, the display panel DP, a panel protective layer PPL, a barrier layer BRL, a support layer PLT, a cover layer SCV, a heat dissipation layer, a cushion layer CUL, an insulating layer INL, a spacer SPC, a step difference compensation pattern CP and second, third, fourth, fifth, sixth, seventh, eighth, ninth, tenth, and eleventh adhesive layers AL2, AL3, AL4, AL5, AL6, AL7, AL8, AL9, AL10, and AL11. The second to eleventh adhesive layers AL2 to AL11 may include a transparent adhesive, such as a pressure sensitive adhesive or an optically transparent adhesive. In some embodiments of the present disclosure, some components among the above-mentioned components may be omitted. For instance, the step difference compensation pattern CP and tenth and eleventh adhesive layers AL10 and AL11 associated with the step difference compensation pattern CP may be omitted.

The optical film LF may be located in the first area AA1 shown in FIG. 3A. The optical film LF may cover at least the display area DP-DA. The optical film LF may be coupled to the window WM by the second adhesive layer AL2, and the optical film LF may be coupled to the display panel DP by the third adhesive layer AL3.

The panel protective layer PPL may be located under the display panel DP. The panel protective layer PPL may protect a lower portion of the display panel DP. The panel protective layer PPL may include a flexible plastic material. For example, the panel protective layer PPL may include polyethylene terephthalate. In some embodiments of the present disclosure, the panel protective layer PPL might not be located in the bending area BA. The panel protective layer PPL may be coupled to the display panel DP by the fourth adhesive layer AL4, and the panel protective layer PPL may be coupled to the barrier layer BRL by the fifth adhesive layer AL5.

The panel protective layer PPL may include a first panel protective layer PPL-1 that protects the first area AA1 of the display panel DP and a second panel protective layer PPL-2 that protects the second area AA2 of the display panel DP. When the bending area BA is bent, the second panel protective layer PPL-2 together with the second area AA2 may be located under the first area AA1 and the first panel protective layer PPL-1. Because the panel protective layer PPL is not located in the bending area BA, the bending area BA may be more easily bent. The fourth adhesive layer AL4 may include a first portion AL4-1 corresponding to the first panel protective layer PPL-1 and a second portion AL4-2 corresponding to the second panel protective layer PPL-2.

The barrier layer BRL may be located under the panel protective layer PPL. The barrier layer BRL may increase a resistance against a compression force caused by an external press. Accordingly, the barrier layer BRL may reduce or prevent deformation of the display panel DP. The barrier layer BRL may include a flexible plastic material, such as polyimide or polyethylene terephthalate. In addition, the barrier layer BRL may be a colored film with low light transmittance. The barrier layer BRL may absorb a light incident thereto from the outside. For example, the barrier layer BRL may be a black plastic film. When viewing the display unit DD from the above of a window WM, components located under the barrier layer BRL may be unseen by the user. The panel protective layer PPL may be coupled to the barrier layer BRL by the fifth adhesive layer AL5, and the barrier layer BRL may be coupled to the support layer PLT by the sixth adhesive layer AL6.

The support layer PLT may be located under the barrier layer BRL. The support layer PLT may include a material having an elastic modulus that is equal to, or greater than, about 60 GPa. The support layer PLT may include a metal material, such as a stainless steel. For example, the support layer PLT may include stainless steel (e.g., SUS 304), however, it should not be limited thereto or thereby. The support layer PLT may include a variety of metal materials. The support layer PLT may support the display panel DP. In addition, the display unit DD may have improved heat dissipation performance by the support layer PLT.

A plurality of openings OP may be defined in an area of the support layer PLT corresponding to the folding area FAO. The flexibility of the support layer PLT may be improved by the openings OP. The sixth adhesive layer AL6 may include a first portion AL6-1 and a second portion AL6-2 spaced apart from the first portion AL6-1. As the sixth adhesive layer AL6 is not located in the area corresponding to the folding area FAO, the flexibility of the support layer PLT may be improved.

A protective layer BPL may be located on the bending area BA of the display panel DP. The protective layer BPL may protect the bending area BA of the display panel DP from the external impacts.

Figure 4:
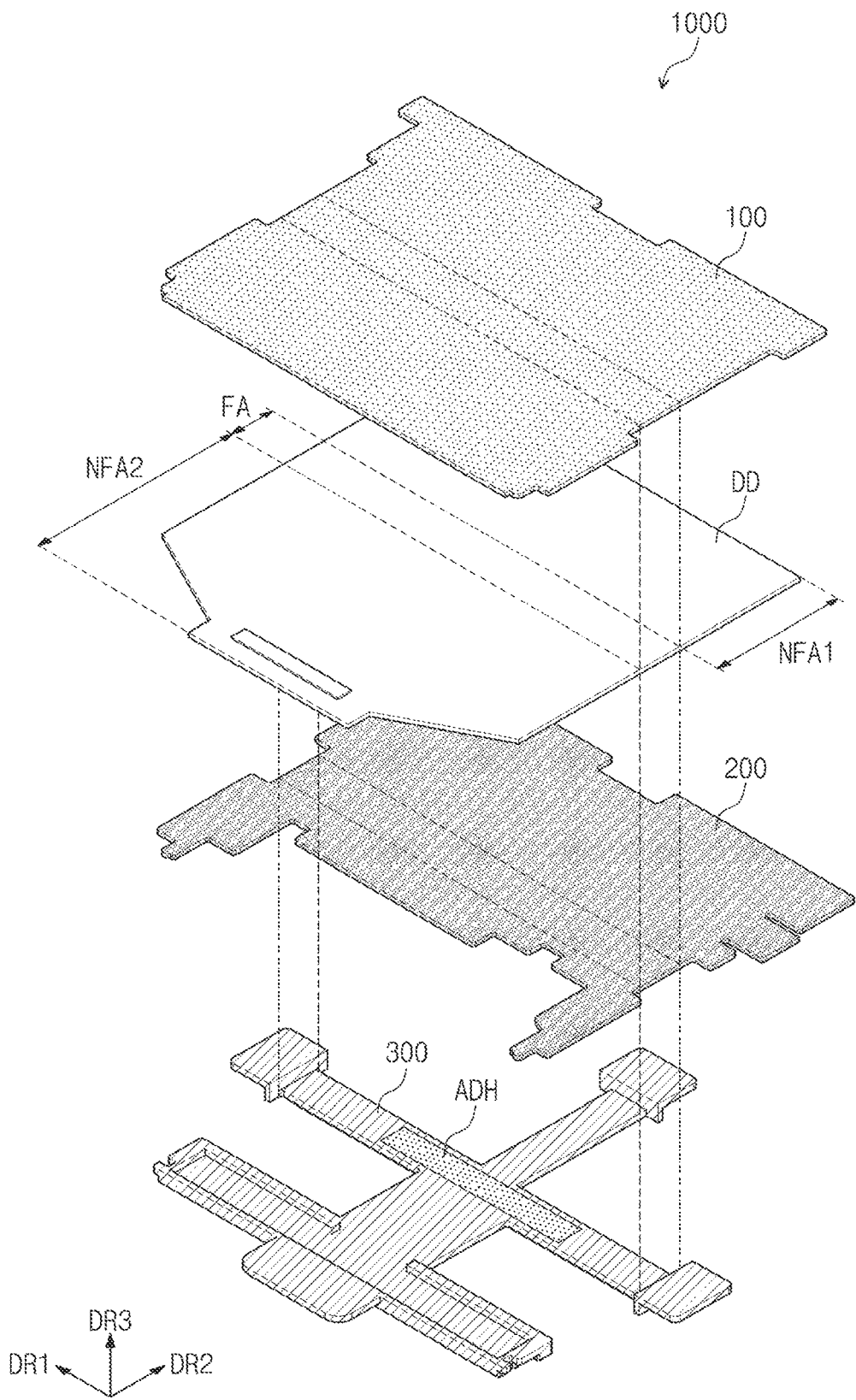
FIG. 4 is an exploded perspective view showing a display device according to some embodiments of the present disclosure.
Figure 5:
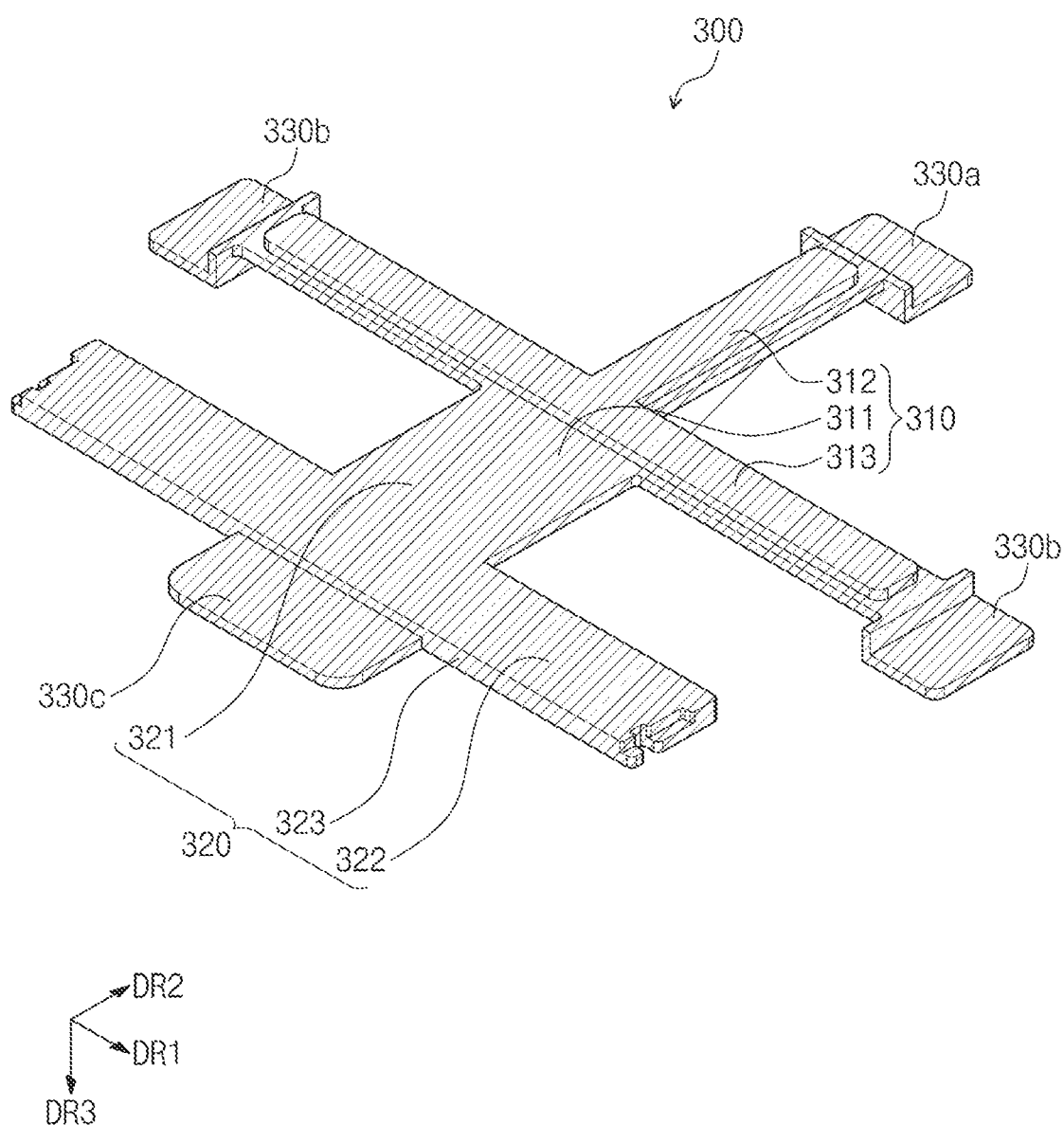
FIG. 5 is a perspective view showing a protective cover according to some embodiments of the present disclosure.

FIG. 4 is an exploded perspective view showing a display device 1000 according to some embodiments of the present disclosure, and FIG. 5 is a perspective view showing a protective cover 300 according to some embodiments of the present disclosure.

The display device 1000 may include the display unit DD. The display device 1000 may include the display unit DD and the protective cover 300 to protect the display unit DD. That is, the display device 1000 may include the protective cover 300 to transfer the manufactured display unit DD without defects in a process of manufacturing the electronic device ED.

Referring to FIG. 4, the display device 1000 may include the display unit DD, a first release film 100, a second release film 200, and the protective cover 300. The display unit DD may include the window WM (refer to FIG. 2) and the display module DM (refer to FIG. 2).

The first release film 100 may be located above the display unit DD. The second release film 200 may be located under the display unit DD. That is, the first release film 100 and the second release film 200 may cover upper and lower surfaces of the display unit DD, respectively. The upper surface of the display unit DD may face the first release film 100, and the lower surface of display unit DD may face the second release film 200.

The protective cover 300 may be located under the second release film 200. The protective cover 300 may be attached to the second release film 200 and may support the display unit DD. As the protective cover 300 covers the window WM including a thin film glass and the folding area FA of the display module DM, defects occurring when the display unit DD of the display device 1000 is transferred may be reduced. This is because the protective cover 300 blocks the external impacts and foreign substances.

FIG. 5 shows the protective cover 300 of FIG. 4, which is turned upside down. The protective cover 300 may be a plastic member such as polycarbonate. The protective cover 300 may be manufactured by conventional plastic molding methods, such as an extrusion molding and an injection molding. However, the material for the protective cover 300 should not be limited thereto or thereby, and the protective cover 300 may be a metal member or an organic/inorganic composite member.

Referring to FIGS. 4 and 5, the protective cover 300 may include a first cover portion 310, a second cover portion 320, and a plurality of holding portions 330a, 330b, and 330c.

The first cover portion 310 may cover the folding area FA and the first non-folding area NFA1 of the display module DM (refer to FIG. 2). The second cover portion 320 may cover the second non-folding area NFA2 of the display module DM. The protective cover 300 may have a variety of shapes depending on the injection molding. As shown in FIG. 5, the protective cover 300 may include protrusion portions formed on a flat plate. For example, the first cover portion 310 may be a flat plate having a bar shape but may have protrusion portions protruded in a thickness direction thereof. In some embodiments, the first cover portion 310 may include a plurality of grooves defined therein. In FIG. 5, the protrusion portions may increase a strength of the first cover portion 310 such that the first cover portion 310 is not bent.

The first cover portion 310 may include a first body portion 311, a first portion 312, and a second portion 313. The first body portion 311 may be connected to the second cover portion 320. The first body portion 311 may be connected to the first portion 312 and the second portion 313. The first portion 312 may extend in the second direction DR2 from the first body portion 311. The first portion 312 may have a bar shape. The second portion 313 may extend from the first body portion 311 to be perpendicular to the first portion 312 when viewed in a plane. That is, the second portion 313 may extend in the first direction DR1 crossing the second direction DR2. The second portion 313 may have a bar shape. The first portion 312 and the second portion 313 may have substantially the same width as each other. The width of the first body portion 311 may be greater than the width of each of the first portion 312 and the second portion 313. In some embodiments, the first portion 312, the second portion 313, and the first body portion 311 may have substantially the same width. In some embodiments, the width of each of the first portion 312 and the second portion 313 may be greater than the width of the first body portion 311.

An adhesive member ADH may be located on a surface of the second portion 313, which faces the second release film 200. The adhesive member ADH may attach the second portion 313 to the second release film 200. That is, the protective cover 300 may be fixed to the second release film 200 by the adhesive member ADH. The second release film 200 may be fixed to the first release film 100 by other adhesive members. This will be described in detail with reference to FIGS. 6, 7, and 8A to 8D.

The second cover portion 320 may support the second non-folding area NFA2. The second cover portion 320 may include a second body portion 321, an arm portion 322, and a sidewall portion 323. The second body portion 321 may be connected to the first cover portion 310. The second body portion 321 may extend from the first body portion 311 of the first cover portion 310. According to some embodiments, the second body portion 321 may be bent from the first cover portion 310. The second body portion 321 may be bent from the first cover portion 310 and may be located farther away from the display unit DD in the third direction DR3. That is, the second cover portion 320 may be located farther from the display unit DD than the first cover portion 310.

The second body portion 321 may cover a portion of the second non-folding area NFA2. The arm portion 322 may extend in the first direction DR1 from the second body portion 321. The arm portion 322 may extend in the first direction DR1 and in a direction opposite to the first direction DR1. The arm portion 322 may cover the bending area BA (refer to FIG. 3C). The sidewall portion 323 may extend from the arm portion 322. The sidewall portion 323 may be located between the arm portion 322 and a third holding portion 330c. The sidewall portion 323 may extend from the arm portion 322 to the third holding portion 330c along the third direction DR3.

The holding portions 330a, 330b, and 330c may extend from the first and second cover portions 310 and 320 and may protrude outside the display module DM. The outside of the display module DM may correspond to an area that does not overlap the display module DM when viewed in a plane.

The holding portions 330a, 330b, and 330c may include a first holding portion 330a, a second holding portion 330b, and the third holding portion 330c. The first holding portion 330a may be coupled to the first portion 312 of the first cover portion 310. The second holding portion 330b may be coupled to the second portion 313 of the first cover portion 310. The second holding portion 330b may be provided in plural. The third holding portion 330c may be coupled to the arm portion 322 or the sidewall portion 323 of the second cover portion 320.

The holding portions 330a, 330b, and 330c may be bent from the first and second cover portions 310 and 320. That is, the holding portions 330a, 330b, and 330c may be located closer to the window WM (refer to FIG. 2) in the third direction DR3 than the first and second cover portions 310 and 320 are. For example, different from the first and second cover portions 310 and 320, the holding portions 330a, 330b, and 330c may be located to be substantially parallel to the display unit DD when viewed in a cross-section. That is, the holding portions 330a, 330b, and 330c may be bent from the first and second cover portions 310 and 320 in a direction toward the window WM.

The holding portions 330a, 330b, and 330c may serve as a handle of the display device 1000. That is, the holding portions 330a, 330b, and 330c may correspond to the handle held by a transfer apparatus for the transfer of the display device 1000 when the display device 1000 is transferred. For example, when the display device 1000 is transferred, a vacuum adsorber may hold the holding portions 330a, 330b, and 330c. The holding portions 330a, 330b, and 330c may provide a flat plate to the vacuum adsorber to allow the vacuum adsorber to adsorb and fix to the holding portions 330a, 330b, and 330c.

The sidewall portion 323 may cover the bending area BA (refer to FIG. 3C) of the display module DM. The arm portions 322 may cover the bending area BA of the display unit DD at an upper direction of the display unit DD. The sidewall portion 323 may cover the bending area BA at a lateral direction. That is, the sidewall portion 323 may protect all components of the display unit DD including the display panel DP (refer to FIG. 3C) that are located in the bending area BA from impacts applied thereto in the lateral direction.

Figure 6:
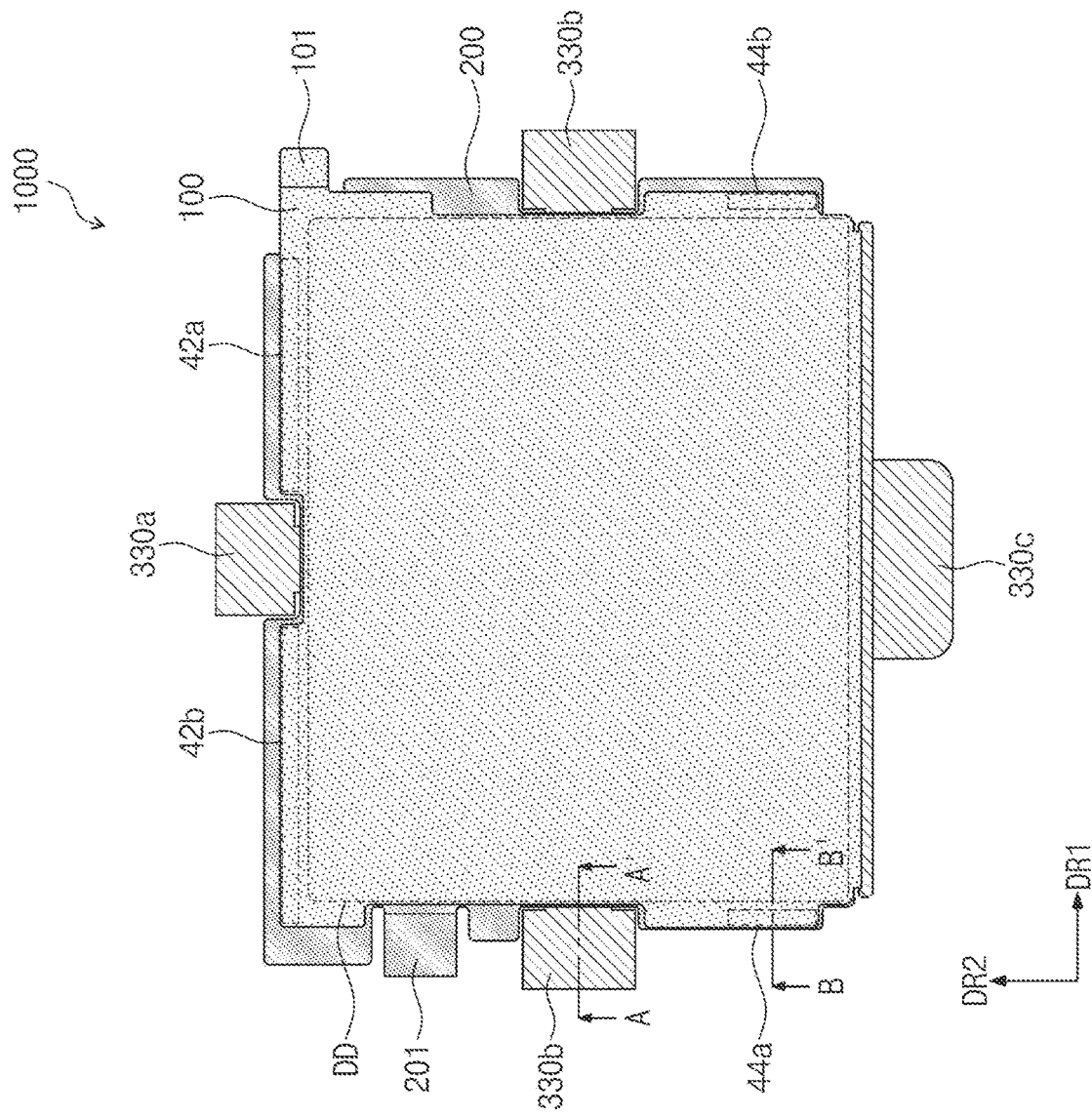
FIG. 6 is a front view showing a display device according to some embodiments of the present disclosure.
Figure 7:
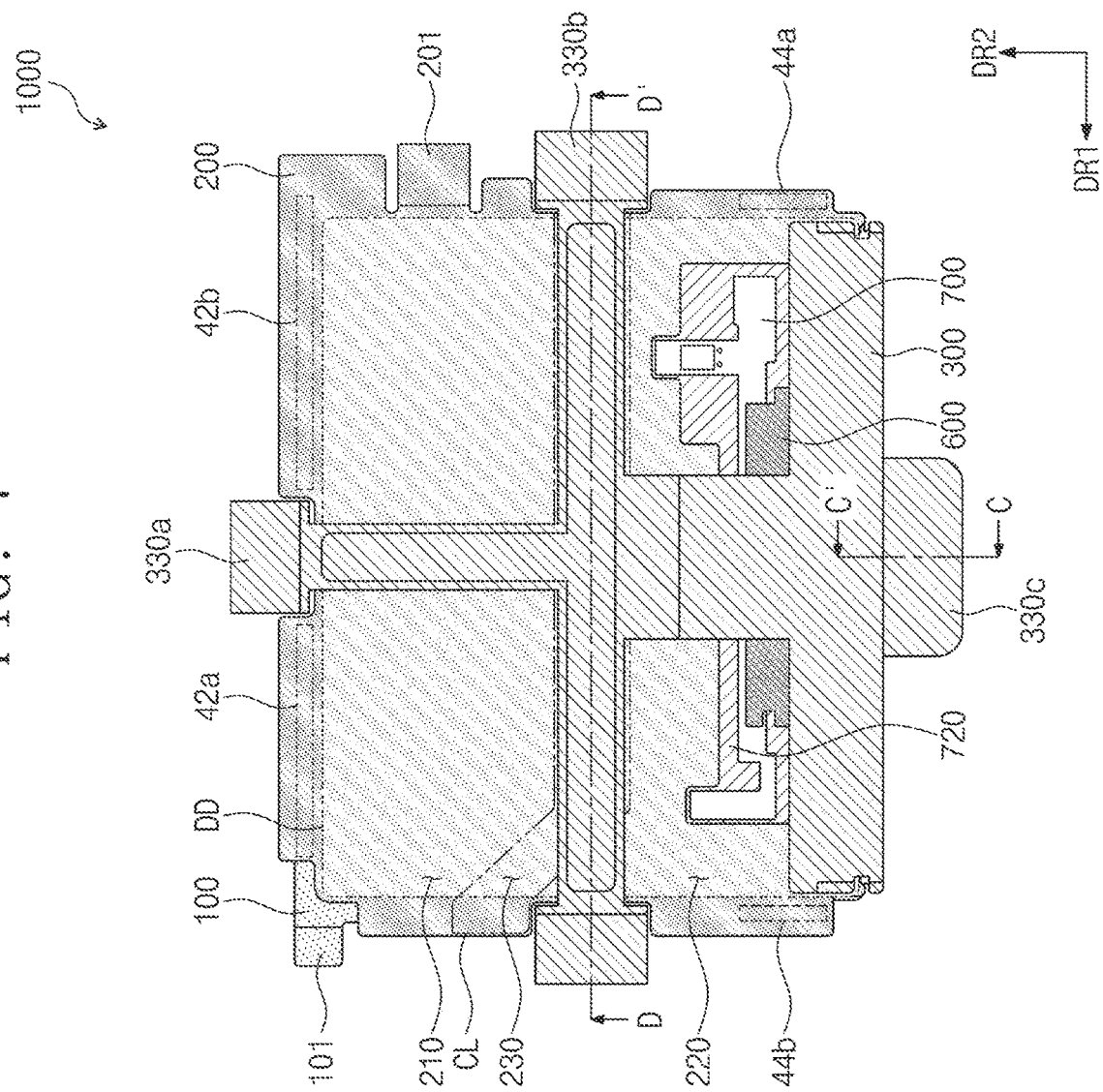
FIG. 7 is a rear view showing a display device according to some embodiments of the present disclosure.

FIG. 6 is a front view showing the display device 1000 according to some embodiments of the present disclosure, and FIG. 7 is a rear view showing the display device 1000 according to some embodiments of the present disclosure. That is, FIGS. 6 and 7 are front and rear views showing the display device 1000 when viewed in the third direction DR3 (refer to FIG. 5) that is substantially perpendicular to the first direction DR1 and the second direction DR2.

Referring to FIGS. 6 and 7, the display unit DD may be located between the first release film 100 and the second release film 200. That is, the first release film 100 and the second release film 200 may respectively cover the upper surface and the lower surface of the display unit DD. In this case, the upper surface of the display unit DD may be a surface that contacts the first release film 100, and the lower surface of the display unit DD may be a surface that contacts the second release film 200. The first release film 100 and the second release film 200 may be attached to each other by adhesive members. The adhesive members may be located outside the display unit DD when viewed in a plane.

According to some embodiments, first adhesive members 42a and 42b may be located at areas respectively adjacent to corresponding sides of the first holding portion 330a. Each of the first release film 100 and the second release film 200 may have an area that is greater than an area of the display unit DD. In the first release film 100 and the second release film 200, portions overlapping the display unit DD may protect the display unit DD. In the first release film 100 and the second release film 200, portions that do not overlap the display unit DD and are protruded to the outside more than the display unit DD in a plane may be attached to each other by the adhesive member. Portions of the first release film 100 and the second release film 200, which are protruded to the outside of the display unit DD, may be attached to each other by the first adhesive members 42a and 42b at the areas respectively adjacent to the sides of the first holding portion 330a.

According to some embodiments, the second adhesive members 44a and 44b may be located between the portions of the first release film 100 and the second release film 200 protruded outside the display unit DD between the second holding portions 330b and the third holding portion 330c.

The first release film 100 may include a first handle portion 101. The first handle portion 101 may correspond to an outermost portion protruded from the first release film 100. The user may hold the first handle portion 101 and then may separate the first release film 100 from the display unit DD.

The second release film 200 may include the second handle portion 201. The second handle portion 201 may correspond to an outermost portion protruded from the second release film 200. The user may hold the second handle portion 201, and then, may separate the second release film 200 from the display unit DD.

As shown in FIGS. 5 and 7, the second release film 200 may include a first portion 210, a second portion 220, and a third portion 230. The first portion 210 may overlap the first non-folding area NFA1 of the display unit DD. The second portion 220 may overlap a portion of the second non-folding area NFA2 of the display unit DD. The first portion 312 of the first cover portion 310 of the protective cover 300 may be located on the first portion 210. The first body portion 311 of the first cover portion 310 and a portion of the second body portion 321 of the second cover portion 320 of the protective cover 300 may be located on the second portion 220. In addition, a portion of the arm portion 322 may be located on the second portion 220. The arm portion 322 may be spaced apart from the second portion 220 in a thickness direction of the display unit DD.

The third portion 230 of the second release film 200 may overlap the folding area FA. The second portion 313 of the first cover portion 310 may be located on the third portion 230. The second portion 313 of the first cover portion 310 may include an adhesive member. The adhesive member may be attached to the third portion 230 of the second release film 200. This will be described in detail with reference to FIG. 8D.

The third portion 230 of the second release film 200 may be removed from the second release film 200 together with the protective cover 300. A cutting line CL may be defined between the first portion 210 and the third portion 230 and between the second portion 220 and the third portion 230 of the second release film 200. The third portion 230 may be removed from the second release film 200 due to the cutting line CL.

A portion of the display unit DD may be exposed through the second portion 220 of the second release film 200. The second release film 200 may expose a flexible circuit board 700 connected to the bending area BA (refer to FIG. 3C) of the display unit DD. An insulating tape 600 and a protective tape 720 may be located on the flexible circuit board 700. A portion of the protective tape 720 may overlap the second release film 200. The insulating tape 600 may be located between the flexible circuit board 700 and the protective cover 300. The protective cover 300 may protect the bending area BA and the portion of the flexible circuit board 700 connected to the bending area BA from the external impacts.

FIGS. 8A to 8D are cross-sectional views showing the display device 1000 according to some embodiments of the present disclosure.

Figure 8C:
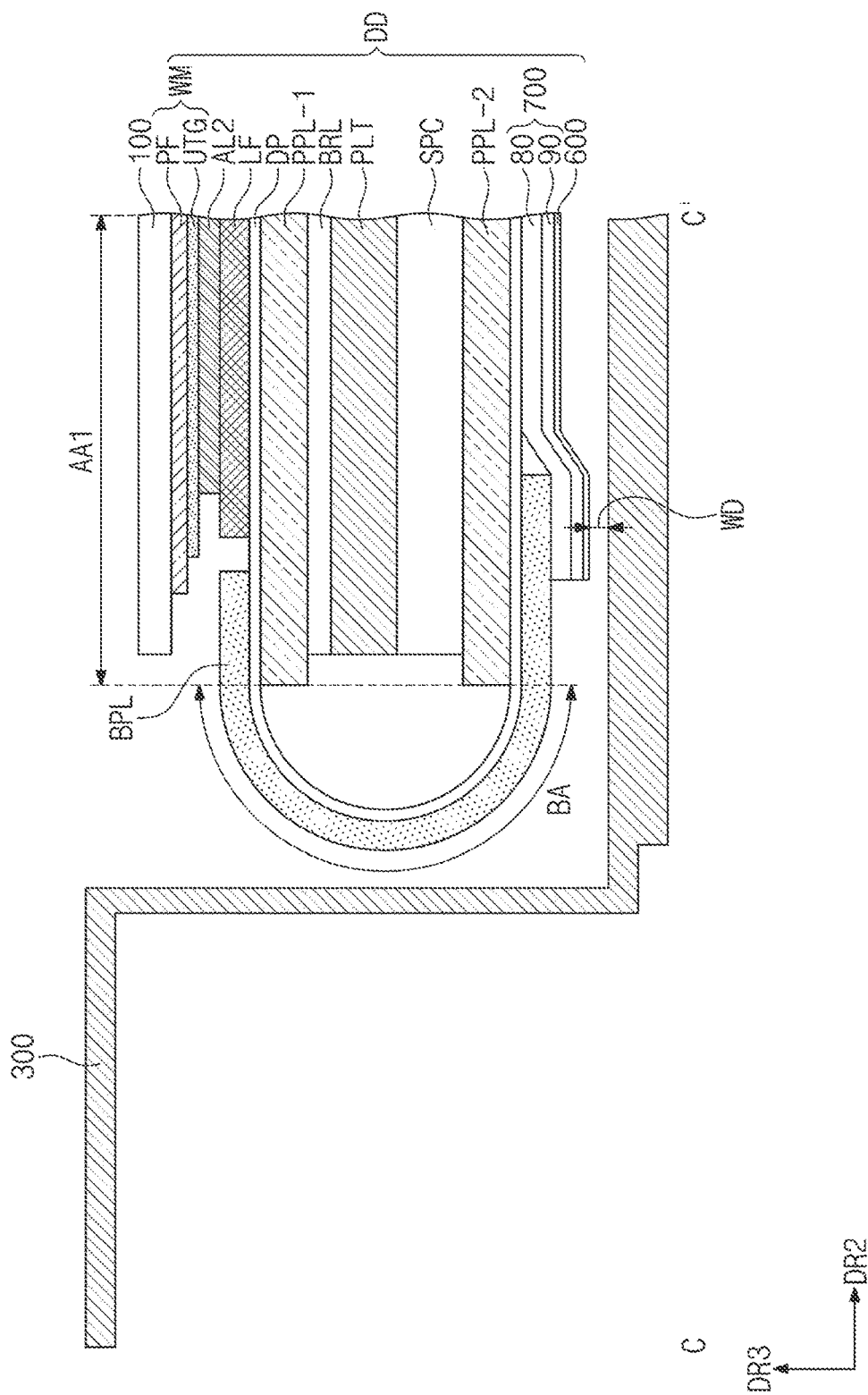

FIG. 8A is a cross-sectional view taken along the line A-A' of FIG. 6. FIG. 8B is a cross-sectional view taken along the line B-B' of FIG. 6. FIG. 8C is a cross-sectional view taken along the line C-C' of FIG. 7. FIG. 8D is a cross-sectional view taken along the line D-D' of FIG. 7.

Referring to FIG. 8A, the second release film 200 may be located on the protective cover 300. When viewed in the cross-section taken along the line A-A', the second release film 200 may not be in contact with the protective cover 300 in the first direction DR1. The protective cover 300 may cover the first release film 100, the second release film 200, and a side surface of the display unit DD in the first direction DR1.

Referring to FIG. 8B, the second adhesive member 44a may connect the first release film 100 to the second release film 200. The second adhesive member 44a may have a thickness that is substantially the same as a thickness of the display unit DD. The thickness may correspond to a length in the third direction DR3.

Referring to FIG. 8C, the protective cover 300 may be spaced apart from the display unit DD in the bending area BA, and in the first area AA1 adjacent to the bending area BA. The first and second release films 100 and 200 might not be located in the bending area BA. When the second release film 200 is not located between the protective cover 300 and the display unit DD, the protective cover 300 may be spaced apart from the display unit DD by a predetermined width WD. That is, the protective cover 300 might not be in contact with the display unit DD. According to some embodiments, the protective layer BPL may be located on the bending area BA of the display panel DP. The flexible circuit board 700 may be located on the protective layer BPL. The flexible circuit board 700 may include an insulating layer 80 and a conductive layer 90. The insulating tape 600 may be located on the conductive layer 90. The protective cover 300 may be located to be spaced apart from the insulating tape 600 along the third direction DR3.

The protective cover 300 may protect the bending area BA of the display unit DD from external impacts in the second direction DR2 and the third direction DR3. In FIGS. 8A to 8D, details of the display unit DD are the same as those of the display unit DD shown in FIG. 3C.

Referring to FIG. 8D, the adhesive member ADH may be located between the protective cover 300 and the second release film 200. The adhesive member ADH may be located to overlap the folding area FA.

Figure 9B:
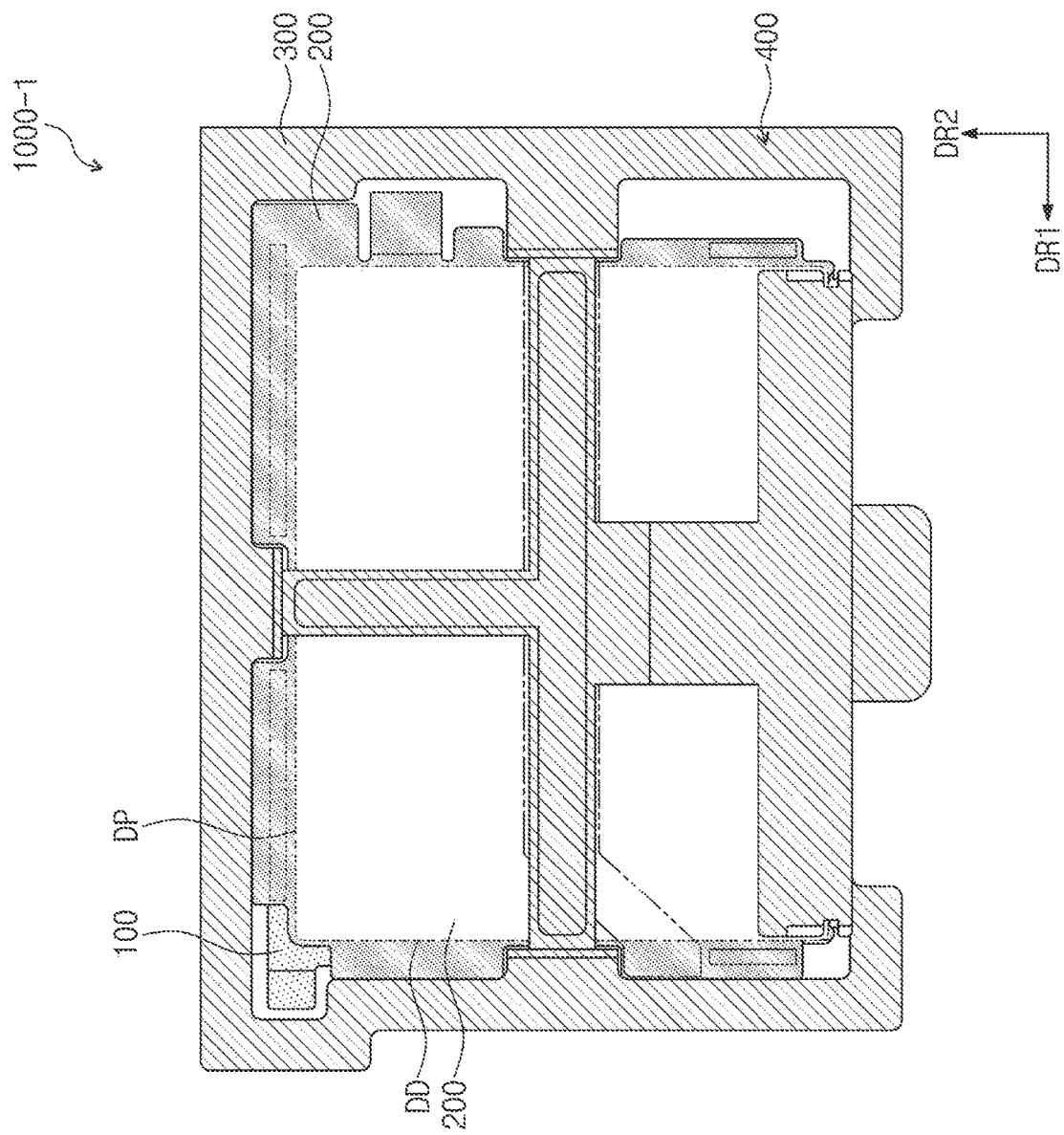
FIG. 9B is a plan view showing a display device according to other embodiments of the present disclosure.

FIG. 9A is a perspective view showing a protective cover according to other embodiments of the present disclosure, and FIG. 9B is a plan view showing a display device 1000-1 according to other embodiments of the present disclosure.

Referring to FIGS. 9A and 9B, a protective cover 300 according to some embodiments may include a connection portion 400 that connects a plurality of holding portions 330a, 330b and 330c to each other. A shape of the connection portion 400 should not be limited thereto or thereby and may have a variety of shapes connecting the holding portions 330a, 330b, and 330c to each other.

According to some embodiments, the connection portion 400 may be connected to the holding portions 330a, 330b, and 330c, or may be connected to a portion of the cover portions. For example, a second holding portion 330b and a third holding portion 330c might not be directly connected to each other. In this case, the second holding portion 330b may be connected to an arm portion 322 of a second cover portion to which the third holding portion 330c is connected. Similar to the holding portions 330a, 330b, and 330c, the connection portion 400 might not overlap the folding area and the non-folding area in a plane, and may be located outside the display unit DD.

Figure 10:
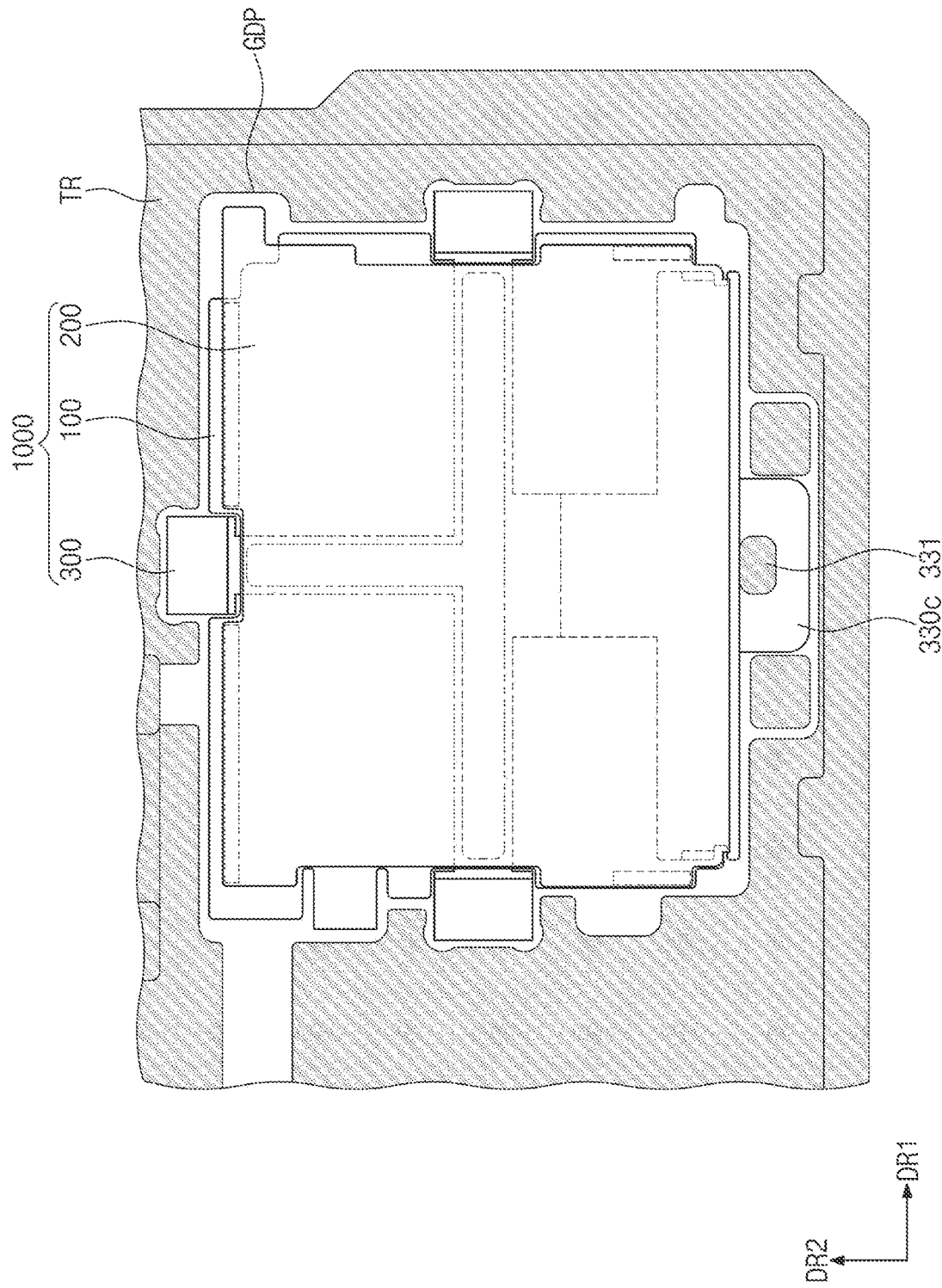
FIG. 10 is a view showing a transfer tray according to some embodiments of the present disclosure.

FIG. 10 is a view showing a transfer tray TR according to some embodiments of the present disclosure.

Referring to FIG. 10, the transfer tray TR may hold and transfer the display device 1000 including the display unit during the manufacturing process of the electronic device ED (refer to FIG. 2). The transfer tray TR according to the present disclosure may include the first and second release films 100 and 200 that protect the display unit and a guide portion GDP corresponding to the shape of the protective cover 300. The guide portion GDP may define a space to accommodate the display device 1000 in the transfer tray TR.

According to some embodiments, the third holding portion 330c of the protective cover 300 may be provided with an opening 331 defined therein. The third holding portion 330c may fix the display device 1000 to the transfer tray TR through the opening 331.

Although some embodiments of the present disclosure have been described, it is understood that the present disclosure should not be limited to these exemplary embodiments but various changes and modifications can be made by one ordinary skilled in the art within the spirit and scope of the present disclosure as hereinafter claimed. Therefore, the disclosed subject matter should not be limited to any of the embodiments described herein, and the scope of the present disclosure shall be determined according to the attached claims, with the functional equivalents thereof to be included therein.

What is claimed is:

1. A display device comprising:
   a display unit; and
   a protective cover on a rear surface of the display unit, and comprising:
   a cover portion configured to cover the rear surface of the display unit; and
   holding portions extending away from the display unit in a first direction, and in a second direction crossing the first direction, from the cover portion, and protruding outside the display unit when viewed in a plane, the first direction and the second direction being substantially parallel with the rear surface of the display unit, wherein each of the holding portions has a shape of a flat plate that is parallel with the first and second directions.

2. The display device of claim 1, wherein the display unit comprises:
a window comprising a thin film glass; and
a display module below the window.

3. The display device of claim 1, wherein the display unit comprises a folding area and a non-folding area adjacent to the folding area,
the non-folding area comprises a first non-folding area and a second non-folding area, which are separated by the folding area, and
wherein the cover portion comprises:
a first cover portion configured to support the folding area and the first non-folding area of the display unit; and
a second cover portion configured to support the second non-folding area.

4. The display device of claim 3, wherein the display unit further comprises a non-bending area comprising the folding area and the non-folding area, and a bending area bent from the non-bending area, and
wherein the second cover portion covers the bending area.

5. The display device of claim 4, wherein the second cover portion comprises:
a second body portion connected to the first cover portion, and configured to cover the second non-folding area; and
an arm portion extending in a direction crossing the second body portion, and configured to cover a portion of the bending area.

6. The display device of claim 5, wherein the second cover portion further comprises a sidewall portion extending from the arm portion, and configured to cover a remaining portion of the bending area.

7. The display device of claim 5, wherein the holding portions comprise a third holding portion extending from the arm portion in a direction away from the second body portion.

8. The display device of claim 3, wherein the first cover portion comprises:
a first body portion connected to the second cover portion;
a first portion extending from the first body portion in a direction away from the second cover portion; and a second portion extending from the first body portion in another direction crossing the direction.

9. The display device of claim 8, wherein the first and second portions have a bar shape, and are perpendicular to each other when viewed in a plane.

10. The display device of claim 8, wherein the second portion is configured to overlap the folding area.

11. The display device of claim 8, wherein the holding portions comprise a first holding portion coupled to the first portion, and second holding portions coupled to the second portion.

12. The display device of claim 1, wherein the holding portions are bent from the cover portion, and are configured to cover a portion of a side surface of the display unit.

13. A display device comprising:
a first area;
a second area adjacent to the first area;
a third area adjacent to the first area;
a window;
a display module on a rear surface of the window, and comprising a non-bending area, and a bending area bent from the non-bending area;
a first release film on the window;
a second release film under the display module; and
a protective cover under the second release film, and comprising:
a first cover portion configured to support the first area and the second area of the display module;
a second cover portion extending from the first cover portion, and configured to support the third area and the bending area of the display module; and
holding portions respectively coupled to the first cover portion and the second cover portion.

14. The display device of claim 13, further comprising adhesive members between the first and second release films, outside the display module, and configured to attach the first and second release films.

15. The display device of claim 13, wherein the second release film comprises:
a first portion overlapping the second area;
a second portion overlapping the third area; and
a third portion overlapping the first area, and wherein the protective cover further comprises an adhesive member attached to the third portion.

16. The display device of claim 15, wherein a cutting line is defined between the first portion and the third portion, and between the second portion and the third portion.

17. The display device of claim 15, wherein the first cover portion comprises:
a first portion on a lower surface of the first portion of the second release film, and extending in a first direction; and
a second portion on a lower surface of the third portion of the second release film, extending in a second direction crossing the first direction, and comprising the adhesive member.

18. The display device of claim 15, wherein the second portion exposes a portion of the non-bending area and the bending area.

19. The display device of claim 18, wherein the second cover portion covers the bending area and the portion of the exposed non-folding area, and is spaced apart from the display module in a thickness direction.

20. A display device comprising:
a display unit; and
a protective cover on a rear surface of the display unit, and comprising:
a cover portion covering the rear surface of the display unit; and
holding portions extending away from the display unit in a first direction, and in a second direction crossing the first direction, from the cover portion, protruding outside the display unit when viewed in a plane, and connected to each other outside the display unit, and
wherein the first direction and the second direction are substantially parallel with the rear surface of the display unit, and
wherein each of the holding portions has a shape of a flat plate that is parallel with the first and second directions.

* * * * *